United States Patent [19]

Mensz

[11] Patent Number: 5,442,204
[45] Date of Patent: Aug. 15, 1995

[54] III-V SEMICONDUCTOR HETEROSTRUCTURE CONTACTING A P-TYPE II-VI COMPOUND

[75] Inventor: Piotr M. Mensz, Ossining, N.Y.

[73] Assignee: Philips Electronics North America Corporation, New York, N.Y.

[21] Appl. No.: 241,840

[22] Filed: May 12, 1994

[51] Int. Cl.[6] .................... H01L 29/161; H01L 33/00
[52] U.S. Cl. ..................................... 257/103; 257/97; 257/185; 257/191; 257/201
[58] Field of Search ............... 257/97, 103, 185, 191, 257/200, 201

[56] References Cited

U.S. PATENT DOCUMENTS

| | | | |
|---|---|---|---|
| 4,916,708 | 4/1990 | Hayakawa | 257/191 |
| 5,300,791 | 4/1994 | Chen et al. | 257/103 |
| 5,341,001 | 8/1994 | Hayashi et al. | 257/200 |
| 5,349,596 | 9/1994 | Molva et al. | 257/191 |

FOREIGN PATENT DOCUMENTS

| | | | |
|---|---|---|---|
| 62-33481 | 2/1987 | Japan | 257/200 |
| 62-88329 | 4/1987 | Japan | . |
| 63-233576 | 9/1988 | Japan | 257/103 |
| 2204731 | 11/1988 | United Kingdom | . |

OTHER PUBLICATIONS

Yates et al, "Structural And Compositional Integrity Of Lattice-Matched Zn Se S on (100) oriented GaAs," Appl.-Phys. Lett. vol. 51, No. 11, 14 Sep. 1987, pp. 809-810.

M. Onomura et al, blue-green laser diode operation of CdZnSe/ZnSe MQW structures grown on InGaP band offset reduction layers, Electronic Letter, Online No. 19931402, 4 Sep. 1993.

*Primary Examiner*—Mahshid D. Saadat
*Attorney, Agent, or Firm*—Norman N. Spain

[57] ABSTRACT

A semiconductor structure useful in blue light emitting diodes and diode lasers is disclosed. The structure is formed of a substrate of p- type GaAs, a layer of a p-type II-VI compound of the formula $Zn_xQ_{1-x}S_ySe_{1-x}$ where $Q=Mg$, Cd or Mn, $0.5 \leq x \leq 1$ and $0 \leq y \leq 1$, separated from the substrate by a series of thin epitaxial undoped or p-doped layers including a layer of $In_{0.5}Al_{0.5}P$ in contact with the layer of the II-VI compound, a layer of $In_{0.5}Ga_{0.5}P$ or of $Al_xGa_{1-x}As$ where $x=0.1-0.3$ contacting the substrate, a layer of $In_{0.5}Ga_{0.5}P$ contacting the layer of $Al_xGa_{1-x}P$ and at least one layer of $In_{0.5}Al_zGa_{0.5-z}P$ where $0<z<0.5$ and the value of z decreases in the direction of the layer of $In_{0.5}Ga_{0.5}P$ provided between and contacting the layer of $In_{0.5}Al_{0.5}P$ and the layer of $In_{0.5}Ga_{0.5}P$.

16 Claims, 5 Drawing Sheets

III-V SEMICONDUCTOR HETEROSTRUCTURE CONTACTING A P-TYPE II-VI COMPOUND

BACKGROUND OF THE INVENTION

The invention in this case relates to a novel semiconductor heterostructure and to a method of producing such a structure.

The invention also relates to a novel laser diode (LD) and to a novel light emitting diode (LED) capable of emitting radiation in the blue-green light emitting region employing the semiconductor structure of the invention.

Kukimoto U.K. Patent Application 2,204,731A shows a light emitting diode having an n-doped GAAs substrate and an n-doped layer of a II-VI compound deposited on the substrate and a p-doped layer of a II-VI compound deposited on the n-doped layer.

More particularly, this U.K. application shows a layer of an n-type $ZnS_xSe_{1-x}$ deposited on a n-type crystal of GaAs and a layer of a p-type $ZnS_xSe_{1-x}$ deposited on the surface of the layer of the n-type $ZnSe_x Se_{1-x}$ and forming a pn junction therewith. Electric contact layers are provided on the surfaces of the layer of the p-type compound and the structure.

While the resulting structure has been found to function as a blue-light emitting diode it is of little or no commercial use as its efficiency (measured as a ratio of the amount of light produced to the electrical power applied) is very poor. One reason for this poor efficiency is considered to be the relatively high resistance present between the GaAs substrate and the layer of the $ZnS_xSe_{1-x}$ deposited on the substrate. This is also considered to be on when, unlike the configuration shown in this U.K. application, the substrate and the layer deposited thereupon are p-type.

Suzuki JP 62-88329(A) shows a structure in which the diffusion of Ga from a GaAs substrate to a layer of a p-type ZnSe compound is prevented by the use of an intervening layer of AlAs P or Al In P.

While the structure of Suzuki exhibits a relatively low resistance P-type conductivity the resistance is not so low as to enable the manufacture of commercially efficient blue-light emitting diodes and laser diodes.

Ogura JP 64-24980 shows a structure for a laser diode in which a first layer of n-type GaINP is provided on a n-type GaAs substrate, a second layer of n-type of AlGaInP is provided on the first layer, a third layer of a GaInP is provided on the second layer, a fourth layer of p-type AlGaInP is provided on the third layer and a layer of ZnSe or ZnSSe is provided so as to extend into and surround a portion of the fourth layer. A layer of p-type GaInP on which a layer of p-type GaAs is provided on the surface of the ZnSe or the ZnSSe layer. However, this diode exhibits red emission rather than blue emission.

M. Onomura et al, Electronics Letters Online No.; 19931402 shows a laser diode having a CdZnSe/ZnSe MQW (multiquantum well) structure in which a band offset reduction layer of p-type InAlGaP is provided between a p-type GaAs substrate and a cladding layer of p-type ZnSe.

The Onomura et al article indicates that the voltage drop between the layer of the p-type GaAs substrate and the p-type ZnSe layer due to the large Schottky and/or heterobarriers therebetween is considerable reduced by the presence of the intervening layer of the p-type InAlGaP layer and indicates that a laser diode comprising such a structure is operable at a temperature of 77K with fairly good efficiency. However, there is no indication in this article of the laser diode operating at a sufficient efficiency at room temperatures so as to make it commercially useful.

Ogura et al JP 89-24980 shows a laser diode comprising a GaAs substrate, a GaInP or AlGAInP active layer provided between two cladding layers having a wider energy band gap than the active layer, the cladding layers containing AlGaInP or AlInP and the cladding layer remote from the substrate having a mesa stripe shaped buried in a ZnSSe layer lattice matched with the active layer or one of the cladding layers.

This laser diode exhibits red light emission rather than blue light emission.

SUMMARY OF THE INVENTION

A principal object of the instant invention is to provide a new and novel semiconductor structure that would be useful in blue light emitting semiconductor diodes and diode lasers. Another object of the instant invention is to provide blue light emitting semiconductor diodes and diode lasers of improved efficiency.

These and other objects of the invention will be apparent from the description that follows.

According to one aspect of the invention a new and novel semiconductor structure is provided. This structure comprises a layer of a p-type II-VI compound of the formula $Zn_xQ_{1-x}S_ySe_{1-y}$ wherein Q is an element selected from the group consisting of Mg, Cd and Mn, $0.5 \leq x \leq 1$ and $0 \leq y \leq 1$ in ohmic contact with a substrate of p-type GaAs. This layer and the substrate is separated by a series of thin epitaxial layers each of a thickness of 20A° to 2000A° of a total thickness of up to 2 μm of undoped or p doped compounds. This series of layers contacts opposing surfaces of the substrate and the layer of the p-type II-VI compound. This series of layers comprises a layer of $In_{0.5}Al_{0.5}P$ contacting the opposing surface of the layer of the p-doped II-VI compound, A layer of $In_{0.5}Ga_{0.5}P$ or a layer of $Al_xGa_{1-x}As$ wherein $x=0.1-0.3$ contacting the opposing surface of the substrate, a layer of $In_{0.5}Ga_{0.5}P$ contacting the surface of the layer of $Al_xGa_{1-x}As$ when present and at least one layer of $In_{0.5}Al_zGa_{0.5-z}P$ wherein $0<z<0.5$ and wherein the value of z decreases in the direction of the layer of $In_{0.5}Ga_{0.5}p$ provided between and contacting the opposing surfaces of the layer of $In_{0.5}Ga_{0.5}P$ and the layer of $In_{0.5}Al_{0.5}P$.

The layers between the substrate and the layer of the II-VI compound may be p-doped or undoped.

The layer of $In_{0.5}Al_zGa_{0.5-z}P$ may be in form of a single layer or may be in form of two or more sublayers. This novel structure of the invention is particularly useful in blue-light emitting semiconductor laser diodes. Thus, it has been found that the large Schottky and/or heterobarriers existing between the p-type GaAs substrate and the p-type II-VI compound layer is significantly reduced thereby resulting in production in the voltage drop so as to allow such semiconductor diodes and semiconductor laser diodes to operate at room temperatures would significantly improve efficiency.

According a further aspect of the invention a new and novel blue light emitting semiconductor diode is provided. According to still another aspect of the invention a new and novel laser diode emitting blue light is provided.

DETAILED DESCRIPTION OF THE INVENTION

Figure 1:
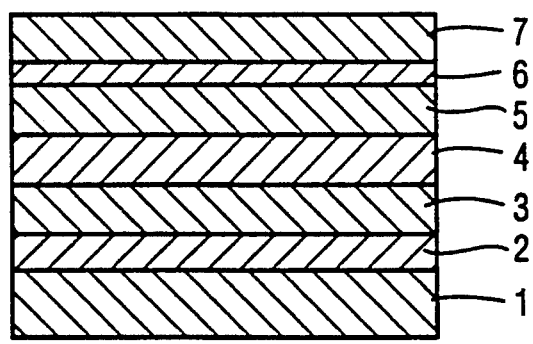
FIG. 1 is a cross-sectional view of a first preferred embodiment of the semiconductor structure of the invention.

The invention will now be described in greater detail with reference to the figures of the drawing and the following examples.

According to a preferred embodiment of the invention the p-type II-VI compound is p-type ZnSSe according to an additional preferred embodiment of the invention.

The layer of the II-VI compound is doped with N and the other layers including the GaAs substrate are doped with Zn.

According to a still further embodiment of the invention, doping concentration of the layers including the substrate is at least $10^{16}$ cm$^{-3}$ and according to a still further preferred aspect of the invention the doping concentration of all the layers including the substrate is $10^{16}$ cm$^{-3}$–$10^{20}$ cm$^{-3}$. According to an additional preferred embodiment of the invention, the thickness of each layer other than the substrate is in the range of 100Å–1000Å.

Furthermore, according to another embodiment of the invention when the series of layers provided between the substrate and the II-VI compound is undoped each layer has a thickness of 20 Å–500 Å and preferably not greater than 100Å.

EXAMPLE 1

Referring to FIG. 1 of the drawing on a substrate 1 of GaAs p-doped to $1\times10^{18}$ cm$^{-3}$ a first 500 Å thick layer 2 of $Al_{0.3}Ga_{0.7}As$ p-doped to $>1\times10^{18}$ cm$^{-3}$ is provided. On the layer 2 a second 1000Å thick layer 3 of $In_{0.5}Ga_{0.5}P$ p-doped to $>1\times10^{18}$cm$^{-3}$ is provided. A 1000Å thick layer 4 of $In_{0.5}Al_{0.20}Ga_{0.30}P$ p-doped to $8\times10^{17}$ cm$^{-3}$ is provided on the layer 3. A layer 5 of $In_{0.5}Al_{0.35}GA_{0.15}P$ p-doped to $4\times10^{17}$cm$^{-3}$ the layer 4. A further layer 6 of a thickness of 250Å of $IN_{0.5}Al_{0.5}P$ p-doped to $4\times10^{16}$ cm$^{-3}$ is provided on the layer 5. A layer 7 of ZnSe of a thickness of and p-doped to $1\times10^{18}$ cm$^{-3}$ is then provided on the layer 6.

The p-doped layers 2, 3, 4, 5, and 6 are provided by MOVPE (metalorganic vapor phase epitaxy) according to a method as described in A. Valster et. al. Journal of Crystal Growth 107 (1991)403–409. The trimethylalkyls are employed as the sources of the metals Ga, Al and In. The sources of As and P are arsine and phosphine. The layers 2, 3, 4, 5 and 6 are p-doped with Zn employing dimethyl zinc as the source of zinc.

The layer 7 of p-doped Zn Se is doped with nitrogen and is grown by MBE (molecular beam epitaxy) by a method as described in K. Ohkawa et. al. Journal of Applied Physics, Vol. 50, (1991), L152. In forming the semiconductor structure of FIG. 1 all layers are provided in the same reactor cell with the substrate and the layers provided thereon not removed from the reactor cell until after the layer of p-doped ZnSe is deposited.

EXAMPLE 2

Figure 2:
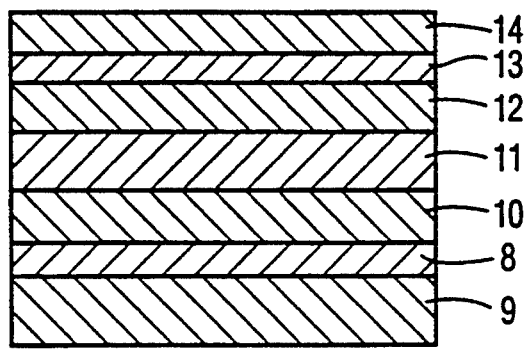
FIG. 2 is a ross-sectional view of an additional preferred embodiment of the semiconductor structure of the invention.

In a similar manner the semiconductor shown in FIG. 2 is formed. Here however there is no doping of the layers between the layer of the p-doped ZnSe and the p-doped GaAs substrate. As shown in FIG. 2 a first 500 Å thick layer of p-$Al_{0.30}Ga_{0.70}As$ 8 doped $1\times10^{18}$cm$^{-3}$ is provided as a p+- doped $>1\times10^{18}$ cm$^{-3}$. A succession of four layers each of a thickness of 100 Å is provided on the layer 8.

The first of these layers is a layer 10 of $In_{0.5}GA_{0.5}P$ doped $1\times10^{18}$cm$^{-3}$. The second is a layer 11 of $In_{0.5}Al_{0.20}Ga_{0.30}P$. The third is a lyer 12 of $IN_{0.5}Al_{0.35}Ga_{0.15}P$ and the last of these layers is a layer 13 of $In_{0.05}Al_{0.5}P$ controlling a layer 14 of p-ZnSe doped $1\times10^{18}$ cm$^{-3}$.

EXAMPLE 3

Figure 3:
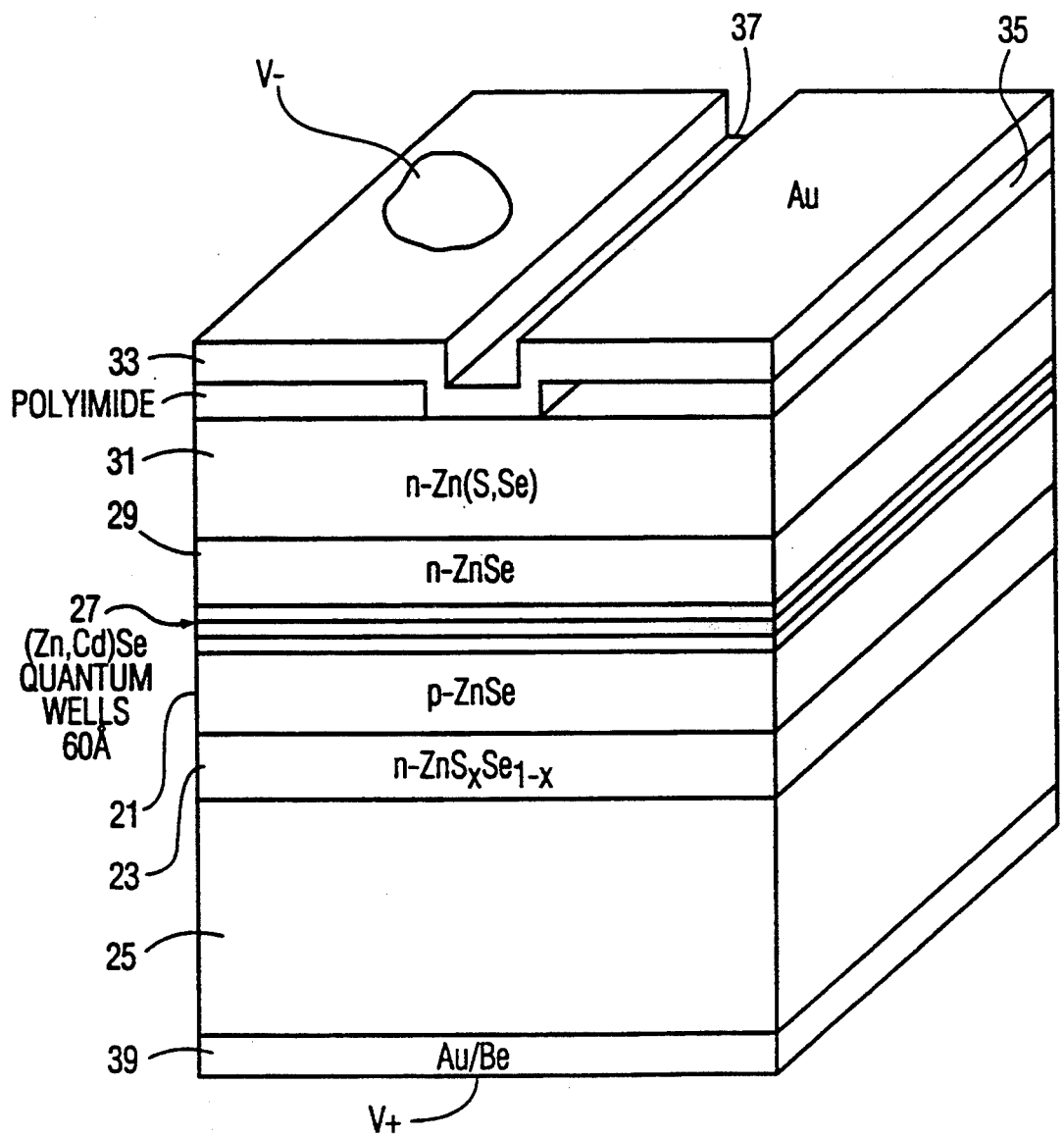
FIG. 3 is a cross-sectional view of a semiconductor diode embodying a semiconductor structure of the invention.

A view of a diode laser incorporated the structure of Example 1 but with the modification that the layer of p-doped ZnSe is replaced by a p-doped layer of $ZnS_xSe_{1-x}$ wherein $0\leq X\leq1$ is shown in FIG. 3.

Here a guiding layer of p-doped ZnSe 21 is provided on the p-doped layer of $ZnS_xS_{1-x}$ 23 of the above-described modified structure of FIG. 1, provided on structure 25 formed of layers 1–6 of the structure of Example 1. Layer 23 functioning as a cladding layer. A lasing region 27 of (Zn,Cl) Se quantumwells and 60 Å thick is provided on the layer 21. A second guiding layer 29 of n-doped ZnSe is provided on the opposing surface of the lasing region 27 and a second cladding layer 31 of n-doped Zn(S,Se) is provided on the second guiding layer 29. An indium contact layer 33 is partially separated from the second cladding layer 31 by intervening insulating layer 35 formed of a polyamide. Layer 35 has an opening 37 allowing contact of the indium contact layer 33 to the second cladding layer 31. A contact layer 39 formed of an Au/Be alloy is provided on the surface of the GaAs substrate.

EXAMPLE 4

Figure 4:
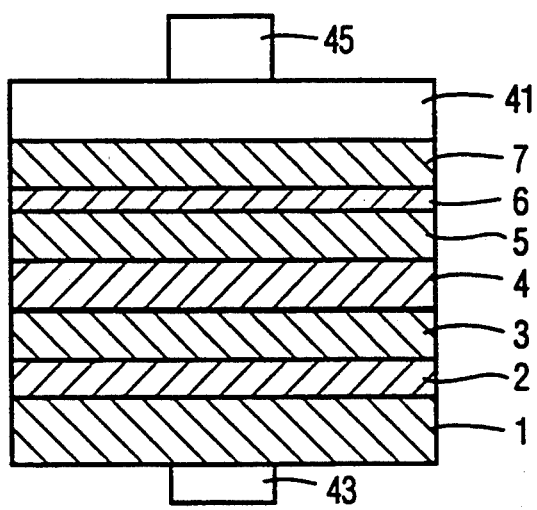
FIG. 4 is a cross-sectional view of a laser diode embodying semiconductor structure of the invention.

A cross sectional view of a semiconductor diode employing the semiconductor structure of Example 1 is shown in FIG. 4. Here layers 1, 2, 3, 4, 5, 6 and 7 are as described in Example 1 Layer 41 is a 5000 Å thick layer of ZnSSe n-doped to a value of which is provided on layer 7. Layer 43 is a contact layer to the substrate, and layer 45 is a contact layer to the n-doped ZnSSe layer 41. Both layers 43 and 45 are formed of In.

Figure 5:
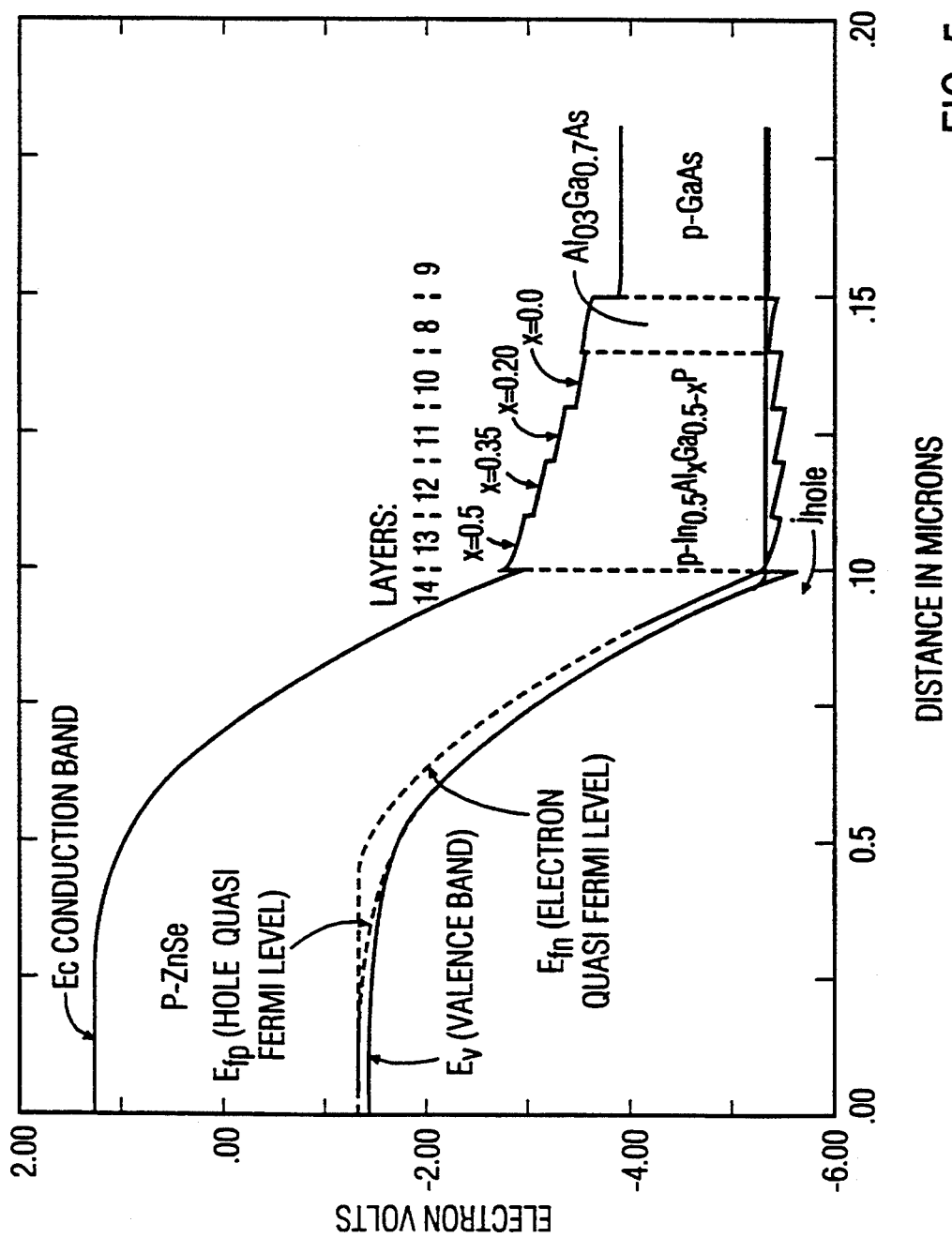
FIG. 5 is an energy band diagram of a semiconductor structure of the invention.

FIG. 5 shows energy band curves derived from calculations based on the structure of Example 2.

Figure 6:
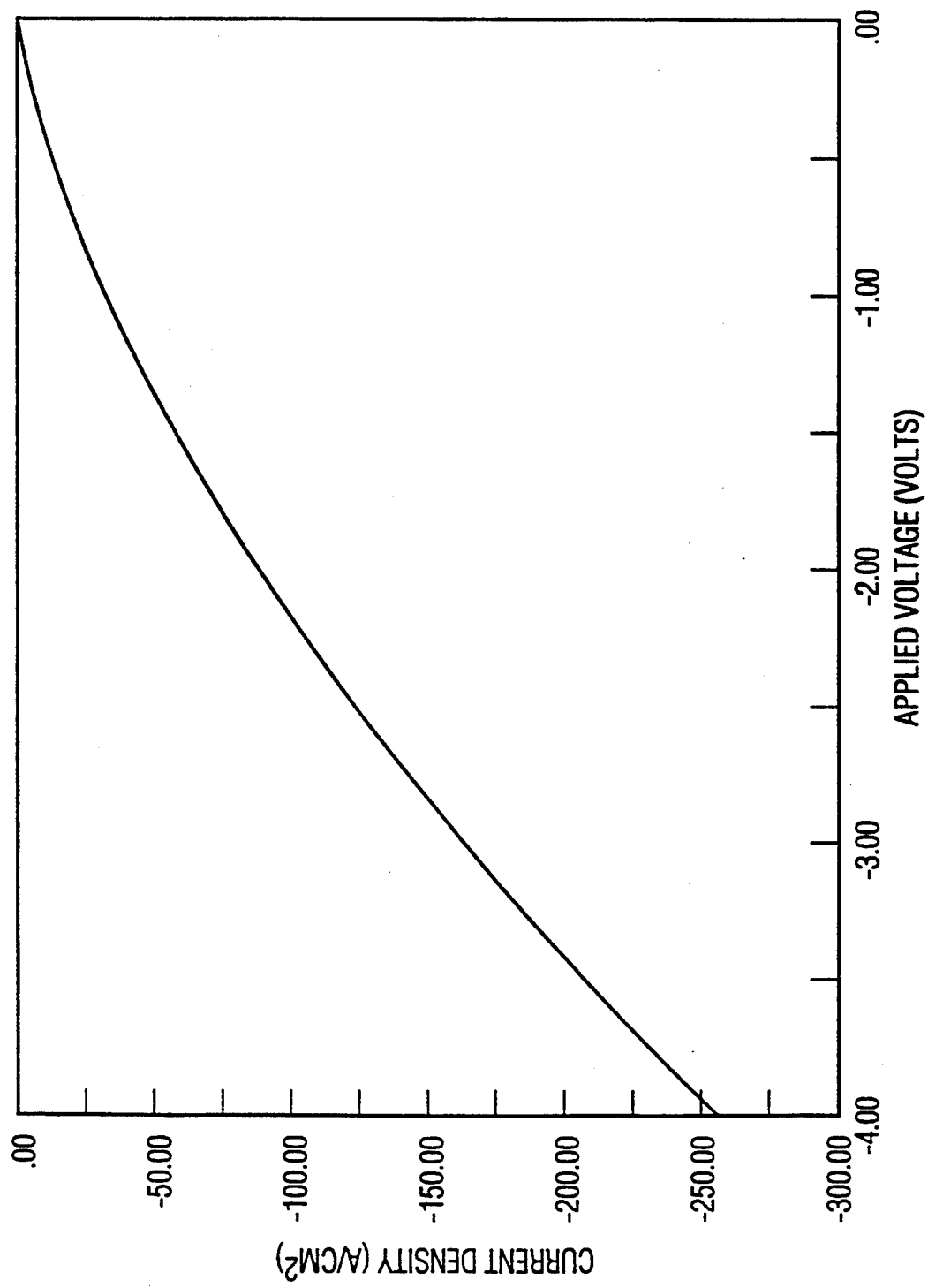
FIG. 6 is a graph of applied voltage to current flow for a semiconductor structure of the invention.

FIG. 6 is a curve of current to voltage of the structure of Example 2.

What is claimed is:

1. A semiconductor structure comprising a first layer of a p-type II-VI compound of the formula $Zn_xQ_{1-x}S_ySe_{1-y}$ wherein Q is an element selected from the group consisting of Mg, Cd and Mn, $0.5\leq x\leq1$ and $0\leq y\leq1$ and a substrate of p-type GaAs, said first layer and said substrate being separated by a series of thin epitaxial undoped or p-doped layers of a total thickness of up to 2 μm and each layer of a thickness of 20 Å to 2000 Å contacting opposing surfaces of said substrate and said first layer, said series of layers comprising a layer of $In_{0.5}Al_{0.5}P$ contacting the opposing surface of said first layer, a layer of a compound selected from the group consisting of $In_{0.5}Ga_{0.5}P$ and $Al_xGa_{1-x}As$ wherein $x=0.1-0.3$ contacting the opposing surface of said substrate, a layer of $In_{0.5}Ga_{0.5}P$ contacting said layer of $Al_xGa_{1-x}As$, at least one layer of $In_{0.5}Al_z Ga_{0.5-z}P$ wherein $0<z<0.5$, the value of z decreasing in the direction of said layer of $In_{0.5}Ga_{0.5}P$ provided between, and having surfaces contacting said layer of $In_{0.5}Al_{0.5}P$ and said layer of $In_{0.5}Ga_{0.5}P$.

2. The semiconductor structure of claim 1 wherein the at least on layer of $In_{0.5}Al_zGa_{0.5-z}P$ is undoped and the thickness of each layer in said series of layers is 20 Å to 500 Å.

3. A semiconductor structure comprising
a first layer of a p-type II-VI compound of the formula $Zn_xQ_{i-x}S_ySe_{1-y}$ wherein Q is an element selected from the group consisting of Mg, Cd and Mn, $0.5<x<1$ and $x/y=\frac{1}{2}$, in ohmic contact with a substrate of p-type GaAs, said first layer and said substrate being separated by a series of thin epitaxial layers, each of a thickness of 200Å to 2000Å and of a total thickness of up to 2 μm, a layer of p-type compounds contacting opposing surfaces of said first layer at said substrate, a layer of p-type $In_{0.5}Al_{0.5}P$ contacting the opposing surface of said first layer, a layer selected from the group consisting of p-type $In_{0.5}Ga_{0.5}P$ and of p-type $Al_xGa_{1-x}As_2$ wherein $x=0.1-0.3$ contacting the opposing surface of said substrate, a layer of p-type $In_{0.5}Ga_{0.5}P$ contacting said layer of p-type $Al_xGa_{1-x}As$, at least one layer of p-type $In_{0.5}Al_zGa_{0.5-z}P$ wherein $0<z<0.5$ provided between, and contacting said layer of p-type $In_{0.5}Ga_{0.5}P$ and said layer of n-type $In_{0.5}Al_{0.5}P$, the value of z decreasing in the direction of said layer of p-type $In_{0.5}Ga_{6.5}P$.

4. The semiconductor structure of claim 3 wherein said at least one layer of p-type $In_{015}Al_2Ga_{0.5-z}P$ is a single layer with the value of z decreasing in the direction of said layer of p-type $In_{0.5}Ga_{0.5}P$.

5. The semiconductor structure of claim 4 wherein the p-type II-VI compound is a p-type ZnSSe.

6. The semiconductor structure of claim 3 wherein said at least one layer of p-type $In_{0.5}Al_zGa_{0.5-z}P$ comprises at least two sublayers of p-type $In_{0.5}Al_zGa_{0.5-z}P$ in which in said at least two layers the value of z decreases in the direction of said layer of p-type $In_{0.5}Ga_{0.5}P$.

7. The semiconductor structure of claim 6 wherein the p-type II-VI compound is p-type ZnSSe.

8. The semiconductor structure of claim 3 wherein the p-type II-VI compound is a p-type ZnSSe.

9. The semiconductor structure of claim 8 wherein each of said layers other than the layer of p-type ZnSSe and said substrate is p-doped with Zn to a dopant concentration of at least $10^{16} cm^{-3}$.

10. The semiconductor structure of claim 9 wherein each of said layers other than the layer of p-type ZnSSe and said substrate is p-doped with Zn to a dopant concentration of $10^{16} cm^{-3} - 10^{18} cm^{-3}$.

11. The semiconductor structure of claim 10 wherein the layer of p-type ZnSSe is doped with N.

12. The semiconductor structure of claim 3 wherein each of said layers other than the layer of the p-type II-VI compound has a thickness of 250Å–1000Å.

13. The semiconductor structure of claim 3 wherein each of said layers other than the layer of the II-VI compound Zn and said substrate is p-doped with Zn to a dopant concentration of at least $10^{16} cm^{-3}$.

14. The semiconductor structure of claim 13 wherein the layer of the p-type II-VI compound is doped with N.

15. A semiconductor diode capable of emitting radiation in the blue-green light emitting region when electrically activated comprising the semiconductor structure of claim 3, a layer selected from the group consisting of n-type ZnSe and ZnSSe provided on a surface of said first layer of p-type II-VI compound and electrically conductive contacts provided on said surface and said first layer.

16. A diode laser capable of emitting radiation in the blue-green light emitting region comprising a lasing region, guiding layers contacting opposing surfaces of the lasing region, cladding layers contacting surfaces of said guiding layers remote from said lasing region and electric contacts provided on surfaces of said cladding layers remote from said guiding layer, one of said cladding layers being formed of the semiconductor structure of claim 3 with a surface of said first layer of a p-type II-VI compound contracting a surface of a guiding layer.

* * * * *

UNITED STATES PATENT AND TRADEMARK OFFICE
CERTIFICATE OF CORRECTION

PATENT NO. : 5,442,204

DATED : August 15, 1995

INVENTOR(S) : PIOTR M. MENSZ

It is certified that error appears in the above-identified patent and that said Letters Patent is hereby corrected as shown below:

Column 3, line 32   add --the-- after "tion," and before "doping".

Column 4, line 25   change "incorporated" to "incorporating".

Column 5, line 14   change "on" to "one".

Signed and Sealed this

Seventh Day of April, 1998

Attest:

BRUCE LEHMAN

*Attesting Officer*        *Commissioner of Patents and Trademarks*